(12) United States Patent
Enomoto

(10) Patent No.: US 7,830,023 B2
(45) Date of Patent: Nov. 9, 2010

(54) RESIN MOLDED SEMICONDUCTOR DEVICE

(75) Inventor: Mitsuyasu Enomoto, Anjo (JP)

(73) Assignee: Denso Corporation, Kariya (JP)

( * ) Notice: Subject to any disclaimer, the term of this patent is extended or adjusted under 35 U.S.C. 154(b) by 487 days.

(21) Appl. No.: 12/038,416

(22) Filed: Feb. 27, 2008

(65) Prior Publication Data

US 2008/0296783 A1 Dec. 4, 2008

(30) Foreign Application Priority Data

May 30, 2007 (JP) ............................. 2007-143337
Nov. 26, 2007 (JP) ............................. 2007-304173

(51) Int. Cl.
*H01L 23/48* (2006.01)
(52) U.S. Cl. ...................... 257/783; 257/701; 257/702; 257/E23.01; 438/126; 438/127
(58) Field of Classification Search ................ 257/783, 257/701, 702, 790, 794, 797, E23.01; 438/126, 438/127
See application file for complete search history.

(56) References Cited

U.S. PATENT DOCUMENTS 4,087,314 A * 5/1978 George et al. ............... 438/614

FOREIGN PATENT DOCUMENTS

JP 1-261850 10/1989

* cited by examiner

*Primary Examiner*—Thinh T Nguyen
(74) *Attorney, Agent, or Firm*—Nixon & Vanderhye PC

(57) ABSTRACT

A semiconductor device includes a circuit board, a wiring part, a protective coating glass, and a resin part. The circuit board has an approximately rectangular shape. The protective coating glass is disposed on the circuit board and is arranged on an inside of the circuit board in such a manner that an outer-peripheral end of the protective coating glass is away from each of four sides of the circuit board at a first distance and is away from each of four corners of the circuit board at a second distance that is larger than the first distance. The resin part seals the circuit board, the wiring part, and the protective coating glass in such a manner that an outer-peripheral end portion of the circuit board that is located on an outside of the protective coating glass directly contact with the resin part.

20 Claims, 7 Drawing Sheets

RESIN MOLDED SEMICONDUCTOR DEVICE

CROSS REFERENCE TO RELATED APPLICATION

This application is based on Japanese Patent Applications No. 2007-143337 filed on May 30, 2007, and No. 2007-304173 filed on Nov. 26, 2007, the contents of which are incorporated herein by reference in their entirety.

BACKGROUND OF THE INVENTION

1. Field of the Invention

The present invention relates to a resin-molded semiconductor device.

2. Description of the Related Art

Conventionally, when a wiring part (e.g., lead frame) is electrically coupled with a circuit wiring formed on a circuit board (e.g., semiconductor substrate) and the wiring part and the circuit board are sealed with a molded resin, a stress may be generated at an interface between the circuit board and the molded resin and/or between mounted parts disposed on the circuit board and the molded resin due to curing of the molded resin. In addition, a thermal stress may be generated at the interfaces when a product including the circuit board is in use. The stresses may cause various problems including a cracking of a protective coating glass disposed on the circuit board and detachments of the interfaces. Furthermore, a disconnecting of a bonding part, a breaking of the mounted parts, and/or a breaking of a joining agent (e.g., solder) for attaching the mounted parts to the circuit board may occur due to the detachments of the interfaces.

When resin is molded after a protective coating glass is coated on the mounted parts disposed on the circuit board and a release agent is applied to an outer surface of the protective coating glass or when a protective coating glass that has a small bonding strength to the molded resin is used, a detachment occurs at an interface between the protective coating glass and the molded resin. Thereby, the stress is not applied to the protective coating glass and the protective coating glass can be prevented from cracking.

In the above-described cases, a portion at which a bonding strength to the molded resin is high, e.g., an end portion of the circuit board, is prone to receive the stress. Thus, a detachment may occur between the end portion of the circuit board and the molded resin. Furthermore, a disconnecting of the bonding part and a breaking of the mounted parts may occur after the detachment progresses.

Alternatively, JP-1-261850A discloses a semiconductor device in which the protective coating glass is coated on the mounted parts disposed on the circuit board, a flexible part that has a low Young's modulus (e.g., silicone resin) is applied to an outside of the protective coating glass, and then resin is molded. Because silicone resin, which is disposed between the protective coating glass and the molded resin, is deformable, the stress is difficult to transfer from the molded resin to the protective coating glass. Thus, the protective coating glass can be prevented from cracking.

However, in this case, solder may crack due to a difference in rates of thermal expansion of the mounted parts and the circuit board depending on a temperature, a size of the circuit board, and a size of the electronic element. Thus, a disconnecting of the bonding part and a breaking of the mounted parts may occur.

SUMMARY OF THE INVENTION

In view of the foregoing problems, it is an object of the present invention to provide a resin-molded semiconductor device that can prevent a disconnecting of a bonding part and a damage of a mounted part disposed on a circuit board.

According to a first aspect of the invention, a semiconductor device includes a circuit board, a wiring part, a protective coating glass, and a resin part. The circuit board has a substrate having an approximately rectangular shape including four sides and four corners, a mounted part disposed on the substrate and including a semiconductor element, a circuit wiring electrically coupled with the mounted part, and a pad electrically coupled with the circuit wiring. The wiring part is fixed to the circuit board through an adhesive agent and is electrically coupled with the pad. The protective coating glass is disposed on the circuit board to cover the circuit wiring and is arranged on an inside of the circuit board in such a manner that an outer-peripheral end of the protective coating glass is away from each of the four sides of the circuit board at a first distance and is away from each of the four corners of the circuit board at a second distance that is larger than the first distance. The resin part seals the circuit board, the wiring part, and the protective coating glass in such a manner that a part of the wiring part is exposed to an outside of the resin part and an outer-peripheral end portion of the circuit board located on an outside of the protective coating glass directly contact with the resin part.

In this semiconductor device, the second distance from each of the four corners of the circuit board to the protective coating glass is larger than the first distance from each of the four sides of the circuit board to the protective coating glass. Thus, the circuit board and the resin part are strongly bonded at four corner portions of the circuit board. The four corner portions of the circuit board are particularly prone to receive a stress, and thereby a detachment between the circuit board and the resin part is prone to occur at the four corner portions of the circuit board. However, because the bonding strength between the resin part and each of the four corner portions of the circuit board is strong, the detachment between the circuit board and the resin part is difficult to occur at the four corner portions of the circuit board.

In addition, because the detachment of the four corner portions of the circuit board and the resin part is prevented, a portion at which the maximum stress is applied can be kept at the four corner portions and is prevented from moving inward from the four corner portions. Thus, a stress applied to the protective coating glass is reduced and the protective coating glass can be prevented from cracking. Thereby, the resin part and the circuit board arranged on opposing sides of the protective coating glass are difficult to be detached from each other due to a cracking of the protective coating glass. As a result, a disconnecting of a bonding part and a breaking of the mounted part can be prevented.

According to a second aspect of the invention, a semiconductor device includes a circuit board, a wiring part, a protective coating glass, and a resin part. The circuit board has a substrate having an approximately rectangular shape, a mounted part disposed on the substrate and including a semiconductor element, a circuit wiring electrically coupled with the mounted part, and a pad electrically coupled with the circuit wiring. The approximately rectangular shape has four sides and four chamfered corner portions, and extended lines that are drawn from the four sides cross each other at four intersection points. The wiring part is fixed to the circuit board through an adhesive agent and is electrically coupled with the pad. The protective coating glass is disposed on the circuit board to cover the circuit wiring and is arranged on an inside of the circuit board in such a manner that an outer-peripheral end of the protective coating glass is away from each of the four sides of the circuit board at a first distance and is away from each of the four intersection points at a second distance that is larger than the first distance. The resin part seals the circuit board, the wiring part, and the protective coating glass in such a manner that a part of the wiring part is exposed to an outside of the resin part and an outer-peripheral end portion of the circuit board located on an outside of the protective coating glass directly contact with the resin part.

When the four corner portions of the circuit board are chamfered, a stress to be applied to the four corner portions can be distributed due to the shape of the four corner portions. Thus, the stress to be applied to the four corner portions of the circuit board can be reduced, and thereby the resin coating and the protective coating glass are difficult to be detached from the circuit board.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE PREFERRED EMBODIMENTS

First Embodiment

Figure 1:
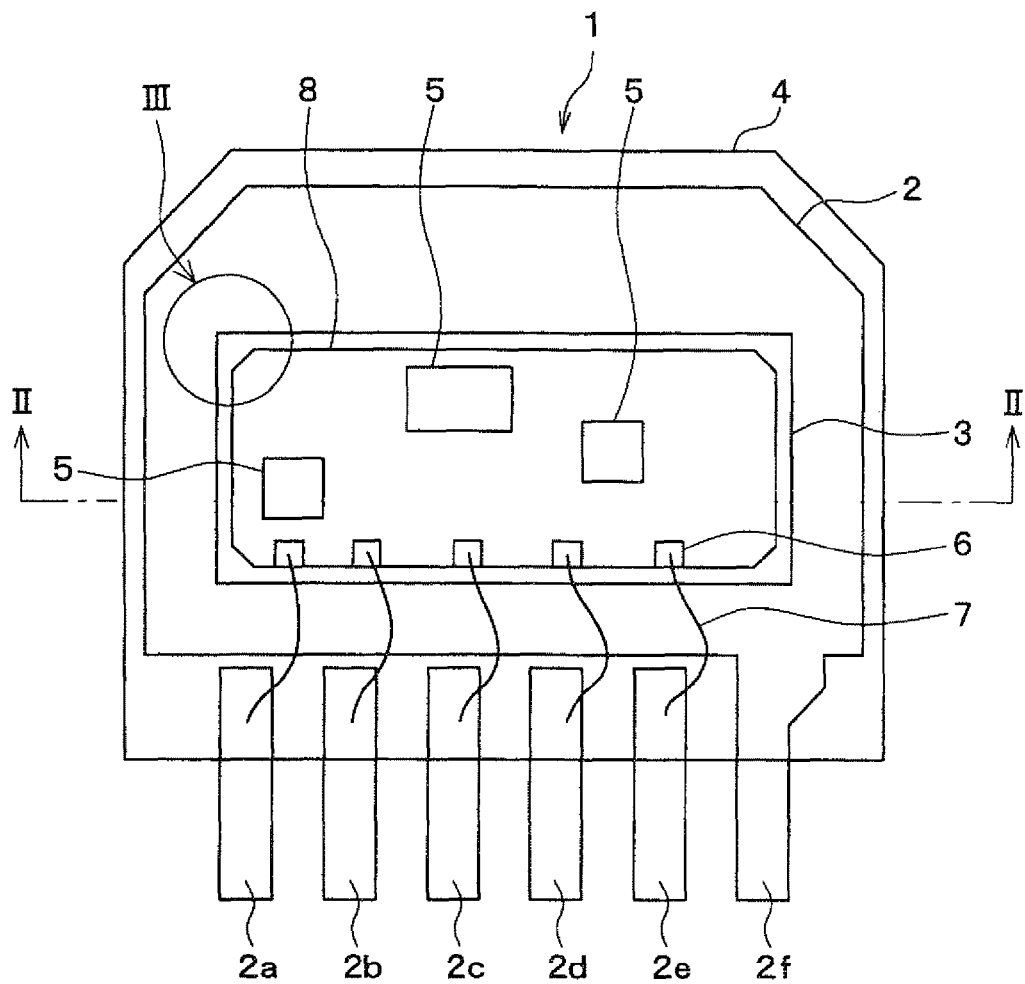
FIG. 1 is a schematic diagram showing a semiconductor device according to a first embodiment of the invention.
Figure 2:
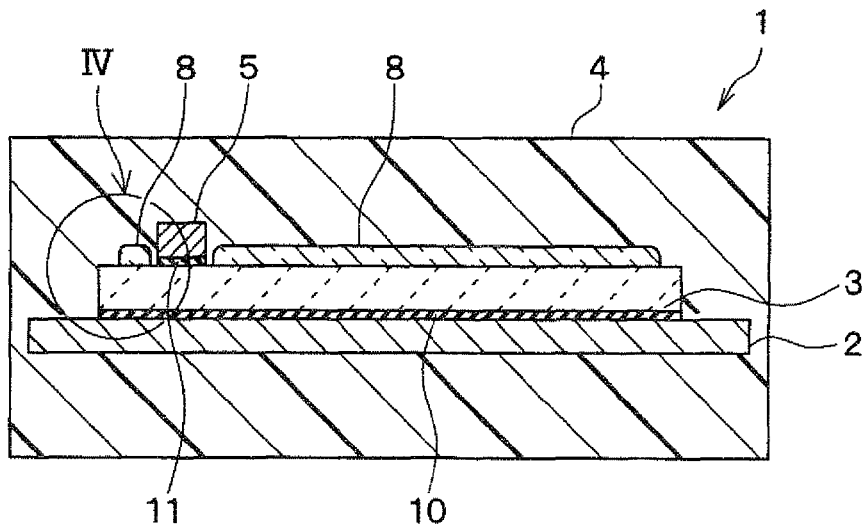
FIG. 2 is a cross-sectional view showing the semiconductor device taken along line II-II in FIG. 1.

A semiconductor device 1 according to a first embodiment of the invention will be described with reference to FIGS. 1-4. The semiconductor device 1 can be suitably used for an ignition device for a vehicular engine (not shown) and can be attached to the vehicular engine directly. As shown in FIGS. 1 and 2, the semiconductor device 1 includes a lead frame 2 (wiring part) made of a conductive material, e.g., metal, a circuit board 3 attached to the lead frame 2 through adhesive agent 10, and a resin part 4 that seals the circuit board 3 and the lead frame 2. The lead frame 2 includes connector terminals 2a-2f. The connector terminals 2a-2f protrude to an outside of the resin part 4 and are configured to be electrically coupled with an external electronic device (not shown).

The circuit board 3 has a substrate made of ceramic, for example. On an upper surface of the substrate, a circuit wiring is pattern-formed. Mounted parts 5 are disposed on a predetermined portion of the circuit board 3 and/or a predetermined portion of the lead frame 2 through a joining part 11. The mounted parts 5 include a semiconductor chip having a semiconductor-switching element for providing the ignition device for the vehicular engine and various electronic elements. The circuit wiring of the circuit board 3 is electrically coupled with a plurality of pads 6. In addition, the pads 6 are electrically coupled with the connector terminals 2a-2f through bonding wires 7. Thereby, power-supply voltage is supplied to each portions of the circuit wiring and input signals are input to each portions of the circuit wiring from an outside of the semiconductor device 1. In addition, output signals from the each portions of the circuit wiring are output to the outside of the semiconductor device 1.

On an upper surface of the circuit board 3, a protective coating glass 8 is disposed to protect the circuit wiring formed on the circuit board 3. The protective coating glass 8 is arranged to cover an area of the circuit board 3 except for a portion at which the mounted parts 5 are disposed, a portion at which the pads 6 are disposed, and an outer-peripheral end portion of the circuit board 3. Thus, the protective coating glass 8 covers the circuit wiring formed in the area of the circuit board 3.

Figure 3:
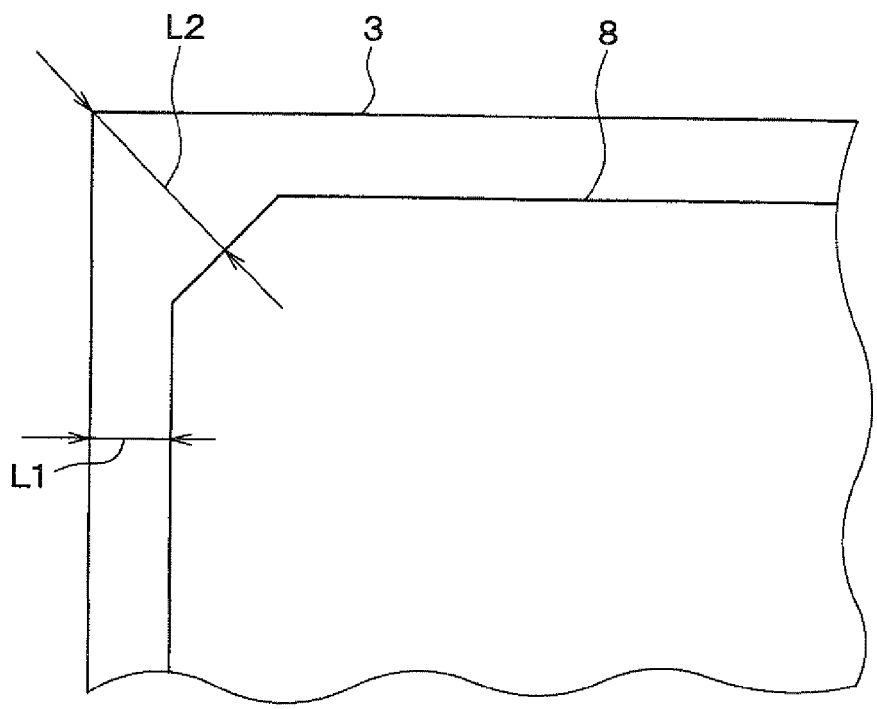
FIG. 3 is an enlarged view showing a part of the semiconductor device shown by an arrow III in FIG. 1.

As shown in FIG. 1, the circuit board 3 has an approximately rectangular shape that includes four sides and four corners. The protective coating glass 8 has an approximately rectangular shape that is smaller than the circuit board 3 and that includes four sides and four chamfered corner portions. As shown in FIG. 3 the protective coating glass 8 is arranged on an inside of the circuit board 3 in such a manner that a first distance L1 between an outer-peripheral end of the protective coating glass 8 and each of the four sides of the circuit board 3 is larger than a predetermined distance. That is, the protective coating glass 8 is not provided on the outer-peripheral end portion of the circuit board 3, and the outer-peripheral end portion of the circuit board 3 is exposed to an outside of the protective coating glass 8. Thus, the resin part 4 is directly bonded to the outer-peripheral end portion of the circuit board 3. The first distance L1 is determined in such a manner that a bonding strength between the outer-peripheral end portion of the circuit board 3 and the resin part 4 is sufficient. For example, the first distance L1 is larger than or equal to about 0.2 mm.

The four corner portions of the protective coating glass 8 are chamfered in such a manner that a second distance L2 between each of the four corners of the circuit board 3 and the protective coating glass 8 is larger than the first distance L1. For example, each of the four corner portions of the protective coating glass 8 has a side that inclines with respect to the four sides of the approximately rectangular shape of the protective coating glass 8. Thereby, the second distance L2 between each of the four corners of the circuit board 3 and the closest portion of the protective coating glass 8, that is, a length of four corner portions of the circuit board 3 on which the resin part 4 is directly bonded, is larger than the first distance L1. For example, the second distance L2 is larger than the first distance L1 by a distance about 0.5 mm or more. Thus, a bonding strength between each of the four corner portions of the circuit board 3 and the resin part 4 is larger than a bonding strength between other portion of the outer-peripheral end portion of the circuit board 3 (i.e., a portion at which a length of an exposed area is the first distance L1) and the resin part 4. For example, the second distance L2 is larger than or equal to about 0.35 mm.

In the semiconductor device 1, materials for each component are selected in such a manner that strengths (bonding strength and breaking strength) of the components satisfy predetermined relationships.

Figure 4:
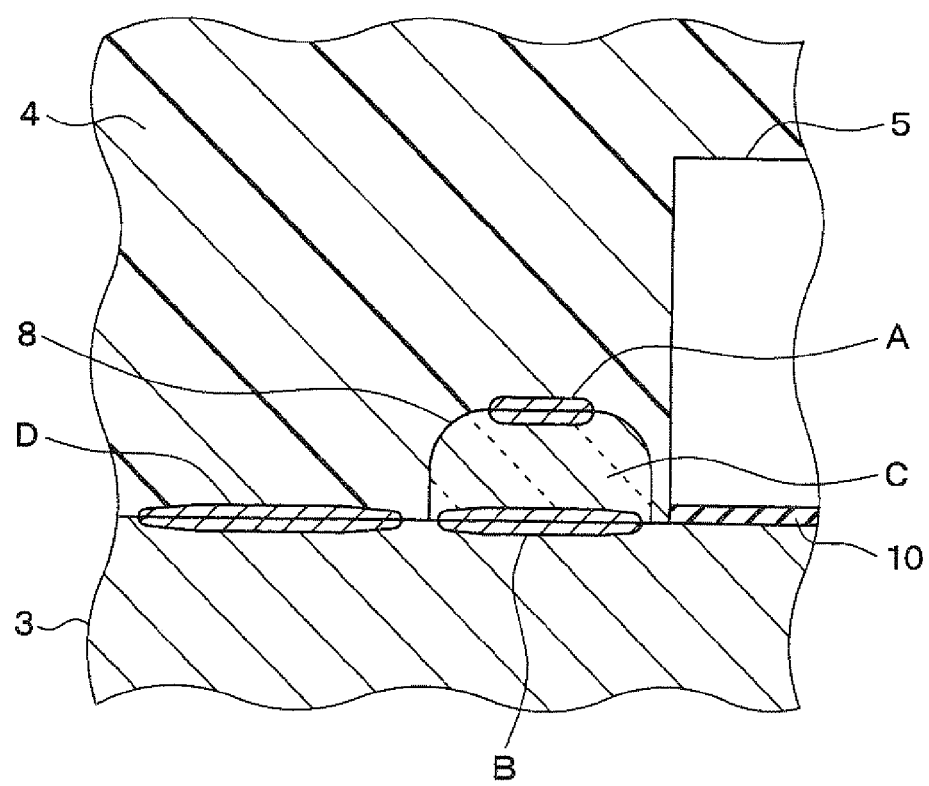
FIG. 4 is an enlarged cross-sectional view showing another part of the semiconductor device shown by an arrow IV in FIG. 2.

Specifically, as shown in FIG. 4, the materials are selected in such a manner that a bonding strength A between the resin part 4 and the protective coating glass 8, a bonding strength B between the protective coating glass 8 and the substrate of the circuit board 3, a breaking strength C of the protective coating glass 8, and a bonding strength D between the resin part 4 and the substrate of the circuit board 3 satisfy relationships of C<A, C<B, and C<D.

As materials that satisfy the above-described relationships, the substrate of the circuit board 3 may be made of ceramic, the resin part 4 may be made of epoxy resin, and the protective coating glass 8 may be made of protective coating glass resin, for example.

As described above, in the semiconductor device 1, the first distance L1 between the outer-peripheral end of the protective coating glass 8 and each of the four sides of the circuit board 3 is larger than the predetermined distance. In addition, the second distance L2 between the outer-peripheral end of the protective coating glass 8 and each of the four corners of the circuit board 3 is larger than the first distance L1. Thus, the outer-peripheral end portion of the circuit board 3 is not covered with the protective coating glass 8, and the resin part 4 is directly bonded to the outer-peripheral end portion of the circuit board 3. In the present case, the bonding strength D between the resin part 4 and the substrate of the circuit board 3 is larger than the breaking strength C of the protective coating glass 8. Thus, a detachment between the circuit board 3 and the resin part 4 can be prevented.

In addition, because the second distance L2 between each of the four corners of the circuit board 3 and the protective coating glass 8 is larger than the first distance L1, a portion at which the circuit board 3 and the resin part 4 are bonded strongly is provided in a wide area. The four corner portions of the circuit board 3 are particularly prone to receive a stress, and thereby a detachment between the circuit board 3 and the resin part 4 is prone to occur at the four corner portions of the circuit board 3. However, because the bonding strength between each of the four corner portions of the circuit board 3 and the resin part 4 is strong, a detachment between the circuit board 3 and the resin part 4 is difficult to occur at the four corner portions of the circuit board 3.

Furthermore, because a detachment between the four corner portions of the circuit board 3 and the resin part 4 is prevented, a portion at which the maximum stress is applied can be kept at the four corner portions and is prevented from moving inward from the four corner portions. As a result, a stress applied to the protective coating glass 8 is reduced. Thus, even when the breaking strength C of the protective coating glass 8 is less than each of the bonding strengths A, B, and D, the protective coating glass 8 is prevented from cracking by reducing the stress applied to the protective coating glass 8.

Thereby, that the resin part 4 arranged on the protective coating glass 8 and the circuit board 3 arranged under the protective coating glass are difficult to be detached from each other due to a cracking of the protective coating glass 8. Thus, a disconnecting of a bonding and a damage of the mounted parts 5 can be prevented.

In addition, each of the bonding strength A between the resin part 4 and the protective coating glass 8 and the bonding strength B between the protective coating glass 8 and the substrate of the circuit board 3 is larger than the breaking strength C of the protective coating glass 8. Thus, a detachment between the resin part 4 and the protective coating glass 8 and a detachment between the protective coating glass 8 and the circuit board 3 are difficult to occur before the protective coating glass 8 cracks. As a result, until the stress reaches the breaking strength C of the protective coating glass 8, a disconnecting of the bonding and a damage of the mounted parts 5 due to a detachment of other portion can be prevented.

When the breaking strength C of the protective coating glass 8 is larger than the bonding strength A between the resin part 4 and the protective coating glass 8, a detachment between the resin part 4 and the protective coating glass 8 may occur before the protective coating glass 8 cracks, and a disconnecting of the bonding may occur. However, when the relationships of C<A, C<B, and C<D are satisfied, a disconnecting of the bonding can be prevented.

Second Embodiment

Figure 5:
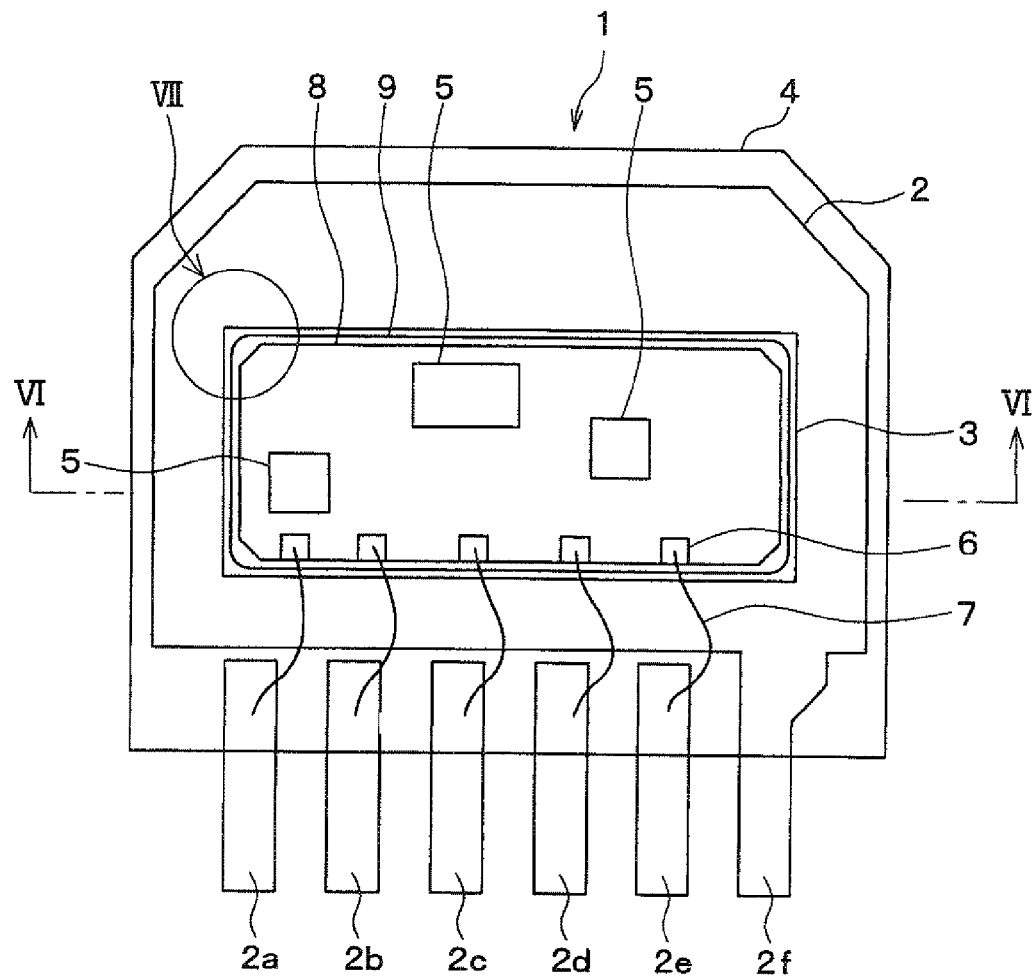
FIG. 5 is a schematic diagram showing a semiconductor device according to a second embodiment of the invention.
Figure 6:
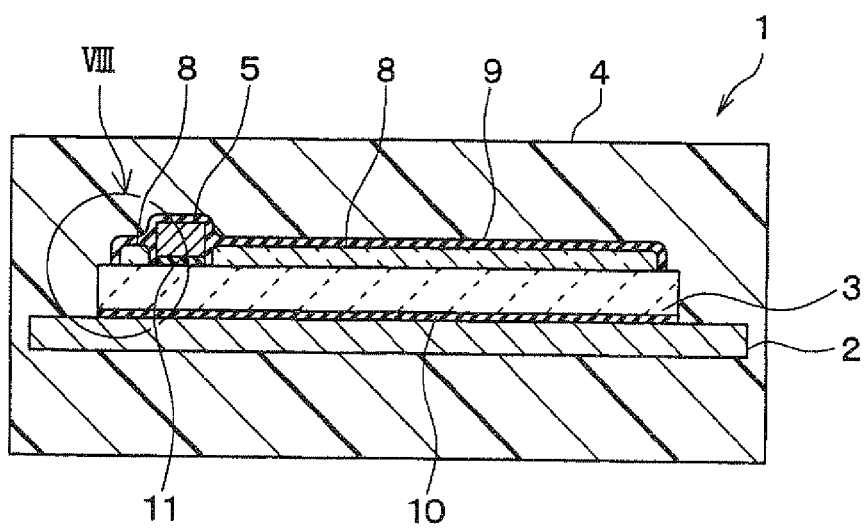
FIG. 6 is a cross-sectional view showing the semiconductor device taken along line VI-VI in FIG. 5.
Figure 7:
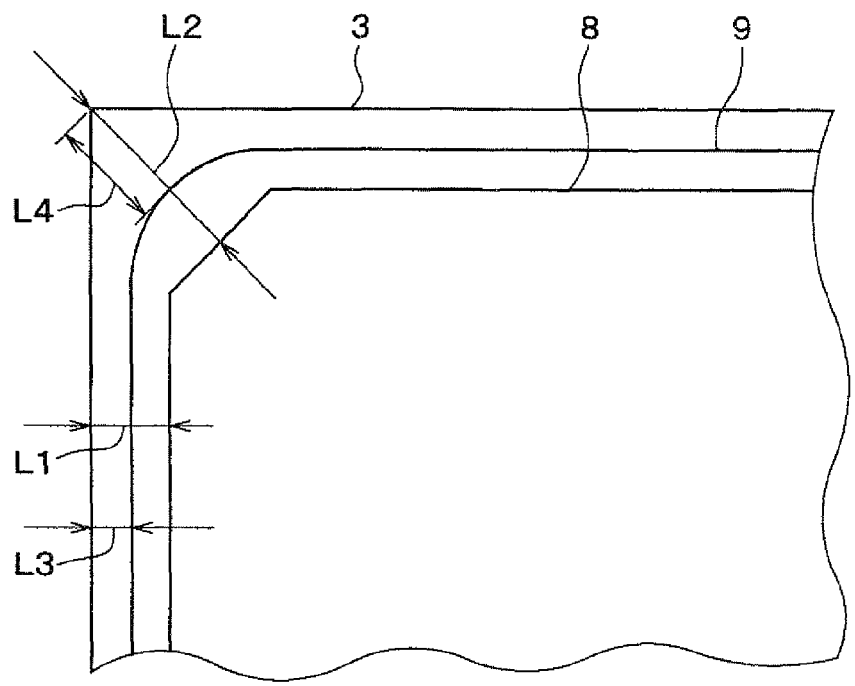
FIG. 7 is an enlarged view showing a part of the semiconductor device shown by an arrow VII in FIG. 5.

A semiconductor device 1 according to a second embodiment of the invention will be described with reference to FIGS. 5-7. In the semiconductor device 1 shown in FIGS. 5 and 6, a resin coating 9 is provided to cover the mounted parts 5 and protective coating glass 8 disposed on the circuit board 3. The resin coating 9 is made of polyamide, polyamide-imide, or polyimide, for example.

The resin coating 9 has an approximately rectangular shape that is smaller than the circuit board 3 and that has four sides and four chamfered corner portions. As shown in FIG. 7, the resin coating 9 is arranged in such a manner that an outer-peripheral end of the resin coating 9 is located between the outer-peripheral end of the protective coating glass 8 and each of the four sides of the circuit board 3. A third distance L3 between the outer-peripheral end of the resin coating 9 and each of the four sides of the circuit board 3 is larger than a predetermined distance. Thus, the resin coating 9 is arranged on the inside of the circuit board 3. As a result, the protective coating glass 8 and the resin coating 9 are not provided on the outer-peripheral end portion of the circuit board 3, and the outer-peripheral end portion of the circuit board 3 is exposed to an outside of the protective coating glass 8 and the resin coating 9. Thus, the resin part 4 is directly bonded to the outer-peripheral end portion of the circuit board 3. The third distance L3 is determined in such a manner that a bonding strength between the outer-peripheral end portion of the circuit board 3 and the resin part 4 is sufficient when the resin coating 9 is provided. For example, the third distance L3 is larger than or equal to about 0.1 mm.

At the four corner portions of the circuit board 3, a shape of the resin coating 9 is determined in such a manner that a fourth distance L4 from each of the four corners of the circuit board 3 to the resin coating 9 is larger than the third distance L3. As shown in FIG. 7, each of the four corner portions of the resin coating 9 is chamfered to have a curved shape, for example. Thereby, the fourth distance L4 from each of the four corners of the circuit board 3 to the closest portion of the resin coating 9, that is, a length of a portion of the circuit board 3 that is exposed to an outside of the resin coating 9 and that is directly attached to the resin part 4, is larger than the third distance L3. Thus, at the four corner portions of the circuit board 3, a portion at which the circuit board 3 and the resin part 4 are bonded strongly is provided in a wide area, compared with the other part of the outer-peripheral end portion of the circuit board 3, i.e., a portion at which a length of an exposed area is the third distance L3. For example, the fourth distance L4 is larger than or equal to about 0.15 mm.

In the semiconductor device 1 according to the second embodiment, materials for each component are selected in such a manner that strengths (bonding strength and breaking strength) of the components satisfy predetermined relationships.

Figure 8:
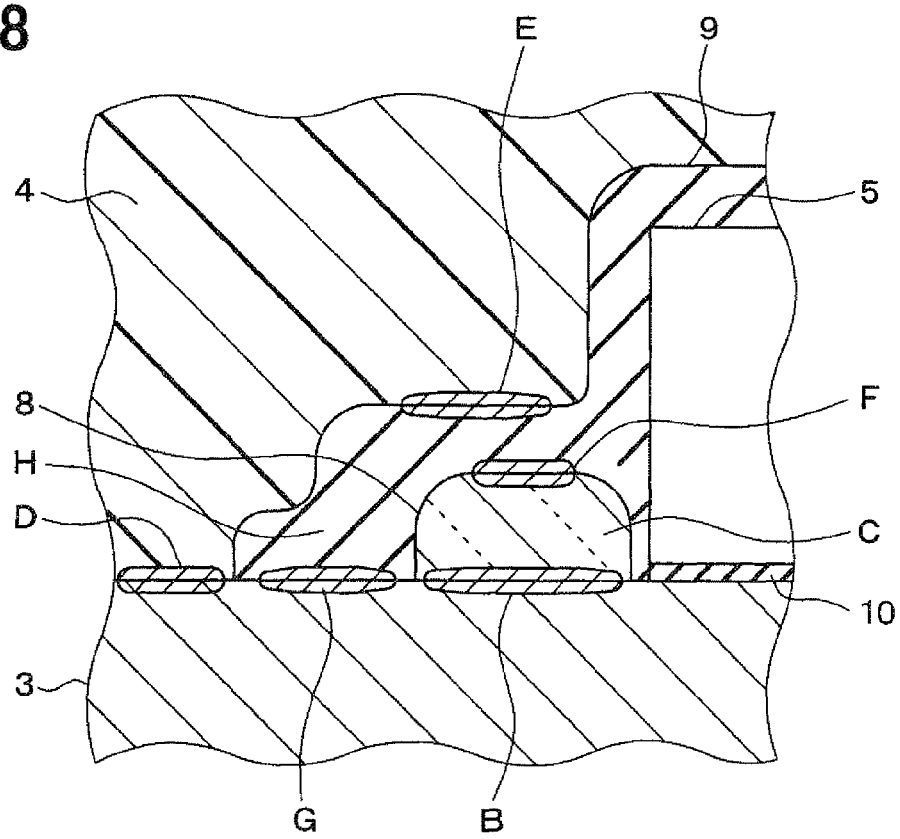
FIG. 8 is an enlarged cross-sectional view showing another part of the semiconductor device shown by an arrow VIII in FIG. 4.

Specifically, as shown in FIG. 8, the materials are selected in such a manner that the bonding strength B between the protective coating glass 8 and the substrate of the circuit board 3, the breaking strength C of the protective coating glass 8, the bonding strength D between the resin part 4 and the substrate of the circuit board 3, a bonding strength E between the resin part 4 and the resin coating 9, a bonding strength F between the resin coating 9 and the protective coating glass 8, a bonding strength G between the resin coating 9 and the substrate of the circuit board 3, and a breaking strength H of the resin coating 9 satisfy the following relationships C<E, C<F, C<B, C<G, D<H, DC<E, and D<G.

As materials that satisfy the above-described relationships, the circuit board 3 may be made of ceramic, the resin part 4 may be made of epoxy resin, the protective coating glass 8 may be made of protective coating glass resin, and the resin coating 9 may be made of polyamide, polyamide-imide, or polyimide, for example.

When the resin coating 9 is made of polyamide resin, a shear strength of a portion at which the resin part 4 is directly bonded to the substrate of the circuit board 3 is about 20 N/mm$^2$. In a case where the resin coating 9 is not applied to the circuit board 3, the shear strength is about 5 N/mm$^2$. Thus, by applying the resin coating 9, the shear strength can be improved about four times.

In the present case, the third distance L3 from each of the four sides of the circuit board 3 to the resin coating 9 is larger than the predetermined distance, and the fourth distance from each of the four corners of the circuit board 3 to the resin coating 9 is larger than the third distance L3. Because the outer-peripheral end portion of the circuit board 3 is exposed to an outside of the resin coating 9, the resin part 4 is directly bonded to the outer-peripheral end portion of the circuit board 3. The bonding strength D between the resin part 4 and the substrate of the circuit board 3 is larger than the breaking strength C of the protective coating glass 8. Thus, a detachment between the circuit board 3 and the resin part 4 can be prevented.

In addition, the bonding strength E between the resin part 4 and the resin coating 9, and the bonding strength G between the resin coating 9 and the substrate of the circuit board 3 are larger than the breaking strength C of the protective coating glass 8. Thus, a detachment between the resin coating 9 and the resin part 4 and a detachment between the resin coating 9 and the circuit board 3 can be prevented, and a detachment due to a breaking of the resin coating 9 can be also prevented. Therefore, the fourth distance L4 from each of the four corners of the circuit board 3 to the resin coating 9 may be shorter than the second distance L2 from each of the four corners of the circuit board 3 to the protective coating glass 8.

Furthermore, because the fourth distance L4 is larger than the third distance L3, the portion at which the circuit board 3 and the resin part 4 are strongly bonded to each other is provided in a wide area at the four corner portions of the circuit board 3. The four corner portions of the circuit board 3 are particularly prone to receive the stress, and thereby a detachment between the circuit board 3 and the resin part 4 is prone to occur at the four corner portions of the circuit board 3. However, because the bonding strength between each of the four corner portions of the circuit board 3 and the resin part 4 is strong, a detachment between the circuit board 3 and the resin part 4 is difficult to occur at the four corner portions of the circuit board 3.

In addition, because a detachment between the four corner portions of the circuit board 3 and the resin part 4 is prevented, the portion at which the maximum stress is applied can be kept at the four corner portions and is prevented from moving inward from the four corner portions. As a result, the stress applied to the protective coating glass 8 is reduced and the protective coating glass 8 is prevented from cracking.

Thereby, the resin part 4 arranged on the protective coating glass 8 and the circuit board 3 arranged under the protective coating glass are difficult to be detached from each other due to a cracking of the protective coating glass 8. Thus, a disconnecting of the bonding and a damage of the mounted parts 5 can be prevented.

In addition, each of the bonding strength B between the protective coating glass 8 and the substrate of the circuit board 3, the bonding strength E between the resin part 4 and the resin coating 9, the bonding strength F between the resin coating 9 and the protective coating glass 8, and the bonding strength G between the resin coating 9 and the substrate of the circuit board 3 is larger than the breaking strength C of the protective coating glass 8. Thus, a detachment between the resin part 4 and the protective coating glass 8 and a detachment between the protective coating glass 8 and the circuit board 3 are difficult to occur before the protective coating glass 8 cracks As a result, until the stress reaches the breaking strength C of the protective coating glass 8, a disconnecting of the bonding and the damage of the mounted parts 5 due to a detachment of other portion can be prevented.

Third Embodiment

Figure 9:
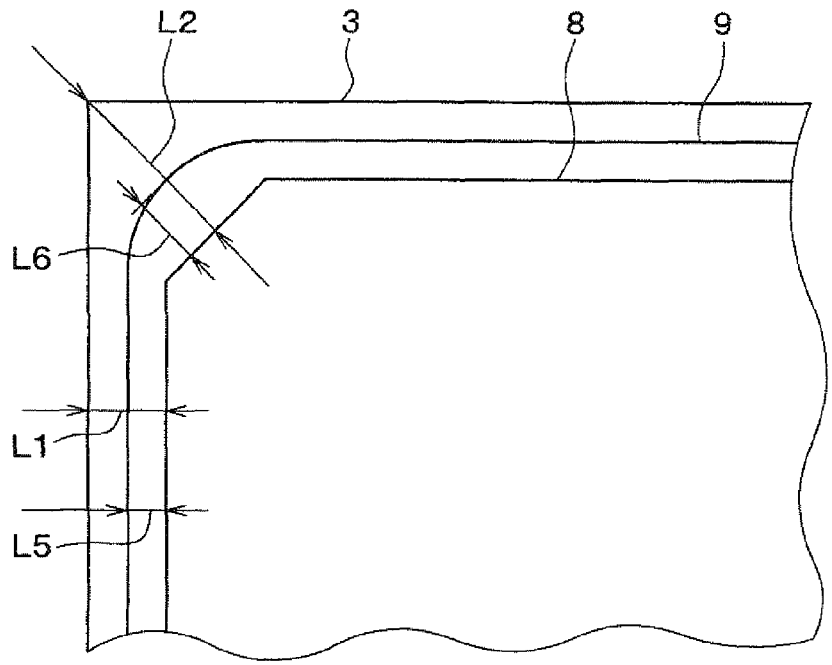
FIG. 9 is an enlarged view showing a part of a semiconductor device according to a third embodiment of the invention.

In a semiconductor device 1 according to a third embodiment of the invention, an alignment of the resin coating 9 with respect to the protective coating glass 8 is determined, as shown in FIG. 9. The other part of the semiconductor device 1 according to the third embodiment is almost similar with the semiconductor device 1 according to the second embodiment.

The resin coating 9 is arranged in such a manner that the outer-peripheral end of the resin coating 9 is located between the outer-peripheral end of the protective coating glass 8 and each of the four sides of the circuit board 3. In the present case, a fifth distance L5 from each side of the resin coating 9 to each side of the protective coating glass 8 is larger than a predetermined distance. Thus, a portion of the resin coating 9 is directly attached to the substrate of the circuit board 3. The fifth distance L5 is determined in such a manner that the resin coating 9 and the circuit board 3 is sufficiently contact with each other and the bonding strength G between the resin coating 9 and the substrate of the circuit board 3 is sufficient. For example, the fifth distance L5 is larger than or equal to about 0.1 mm.

At the four corner portions of the circuit board 3, a shape of the resin coating 9 is determined in such a manner that a sixth distance L6 from the outer-peripheral end of the resin coating 9 to the outer-peripheral end of the protective coating glass 8 is larger than or equal to the fifth distance L5 For example, each of the four corner portions of the resin coating 9 is chamfered to have a curved shape similar with those of the second embodiment.

In the semiconductor device 1 shown in FIG. 9, at the four corner portions of the circuit board 3, the sixth distance L6 from the outer-peripheral end of the resin coating 9 to the closest portion of the protective coating glass 8, that is, a length of the portion of the resin coating 9 directly attached to the substrate of the circuit board 3 is larger than the fifth distance L5 Alternatively, each of the four corner portions of the protective coating glass 8 may have a curved shape almost similar with the resin coating 9 and the sixth distance L6 may be almost equal to the fifth distance L5. For example, the sixth distance L6 is larger than or equal to about 0.1 mm.

In the semiconductor device 1 according to the third embodiment, the outer-peripheral end portion of the resin coating 9 can be directly attached to the substrate of the circuit board 3, and thereby the bonding strength G between the resin coating 9 and the substrate of the circuit board 3 is high. That is, the portion of the resin coating 9 directly attached to the substrate of the circuit board 3 has a large area, and thereby the high bonding strength is provided between the resin coating 9 and the substrate of the circuit board 3. As a result, the resin coating 9 and the protective coating glass 8 are difficult to be detached from the circuit board 3.

In addition, when the arrangement of the resin coating 9 is determined in such a manner that the sixth distance L6 is larger than the fifth distance L5, the bonding strength G between the resin coating 9 and the substrate of the circuit board 3 at the four corner portions of the circuit board 3 is larger than the bonding strength G at the other part of the outer-peripheral end portion of the circuit board 3.

Furthermore, the fifth distance L5 from each of the four sides of the resin coating 9 to each of the four sides of the protective coating glass 8 is larger than the predetermined distance, and the sixth distance L6 from each of the four corners of the resin coating 9 to each of the four corners of the protective coating glass 8 is larger than the fifth distance L5. Thus, the portion of the resin coating 9 directly attached to the substrate of the circuit board 3 has the predetermined area, and the portion of the resin coating 9 directly attached to the substrate of the circuit board 3 has a large area at the four corner portions of the circuit board 3. Thereby, the bonding strength G between the resin coating 9 and the circuit board 3 increases at the four corner portions of the circuit board 3, which is prone to receive the stress. Thus, the resin coating 9 and the protective coating glass 8 are difficult to be detached from the circuit board 3.

In order to verify the above-described effects, a vapor-phase thermal test of a sample can be performed, as was demonstrated by the inventors, in which the fifth distance L5 is about 0.1 mm and the sixth distance L6 is about 0.1 mm. The test is performed in a state where the sample is attached to an ignition coil, functioning as an ignition device for an internal-combustion engine. Specifically, a thermal cycle test, in which the sample is heated from about −30° C. to about 130° C. and then the sample is cooled to about −30° C., is repeated 3000 times. After the vapor-phase thermal test is finished, the sample can be checked by using an ultrasonic flaw detector. Despite the thermal cycle testing, no detachment at an interface between the resin coating 9 and the circuit board 3 is found. Thus, it can be verified that, in accordance with the above-described effects, the resin coating 9 and the protective coating glass 8 are prevented from being detached from the circuit board 3.

Fourth Embodiment

Figure 10:
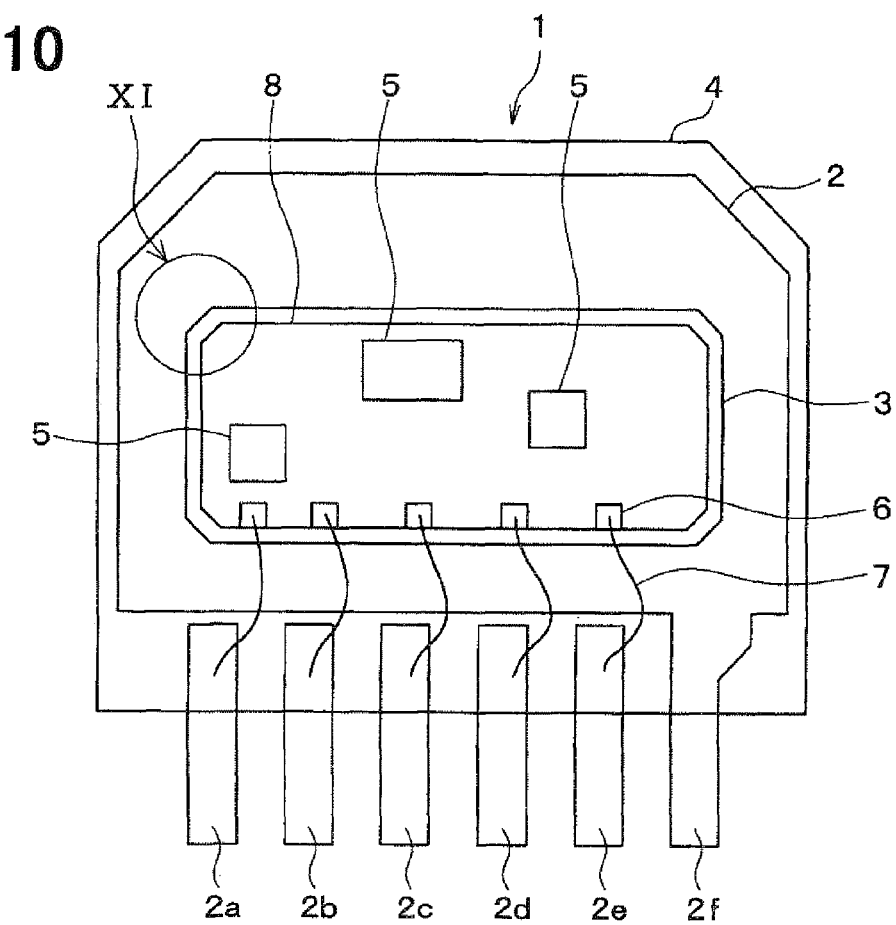
FIG. 10 is a schematic diagram showing a semiconductor device according to a fourth embodiment of the invention.
Figure 11:
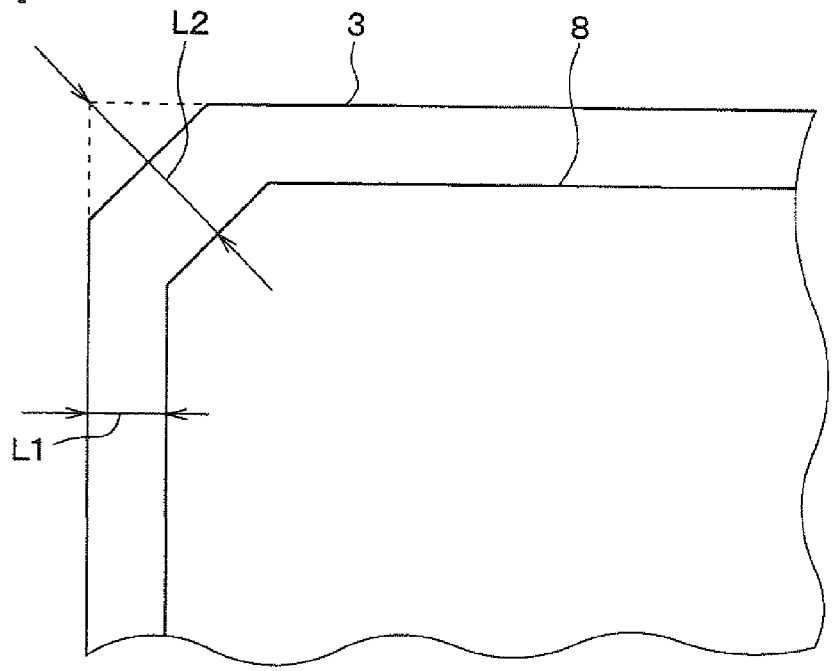
FIG. 11 is an enlarged view showing a part of the semiconductor device showing an arrow XI in FIG. 10.

In a semiconductor device 1 according to a fourth embodiment, the four corner portions of the circuit board 3 are chamfered, as shown in FIGS. 10 and 11. The other part of the semiconductor device 1 is almost similar with the semiconductor device 1 according to the first embodiment.

In the present case, the circuit board 3 does not have the four corners, and thereby the second distance L2 cannot be defined as a distance from each of the four corners of the circuit board 3 to the outer-peripheral end of the protective coating glass 8. However, extended lines may be drawn from each of the four sides of the circuit board 3 as shown by dotted fines shown in FIG. 11, and four intersection points of the extend lines may be supposed as four hypothetical corners of the circuit board 3. Thereby, the second distance L2 is defined as the distance from each of the four hypothetical corners of the circuit board 3 to the outer-peripheral end of the protective coating glass 8. The second distance L2 is determined to satisfy the relationship described in the first embodiment. That is, the shape of the protective coating glass 8 is determined in such a manner that the second distance L2 is larger than the first distance L1. For example, the second distance L2 is larger than the first distance L1 by about 0.05 mm or more.

When the four corner portions of the circuit board 3 are chamfered, the stress to be applied to the four corner portions can be distributed due to the shape of the four corner portions. Thus, the stress to be applied to the four corner portions of the circuit board 3 can be reduced, and thereby the resin coating 9 and the protective coating glass 8 can be prevented from being detached from the circuit board 3 more effectively.

Fifth Embodiment

Figure 12:
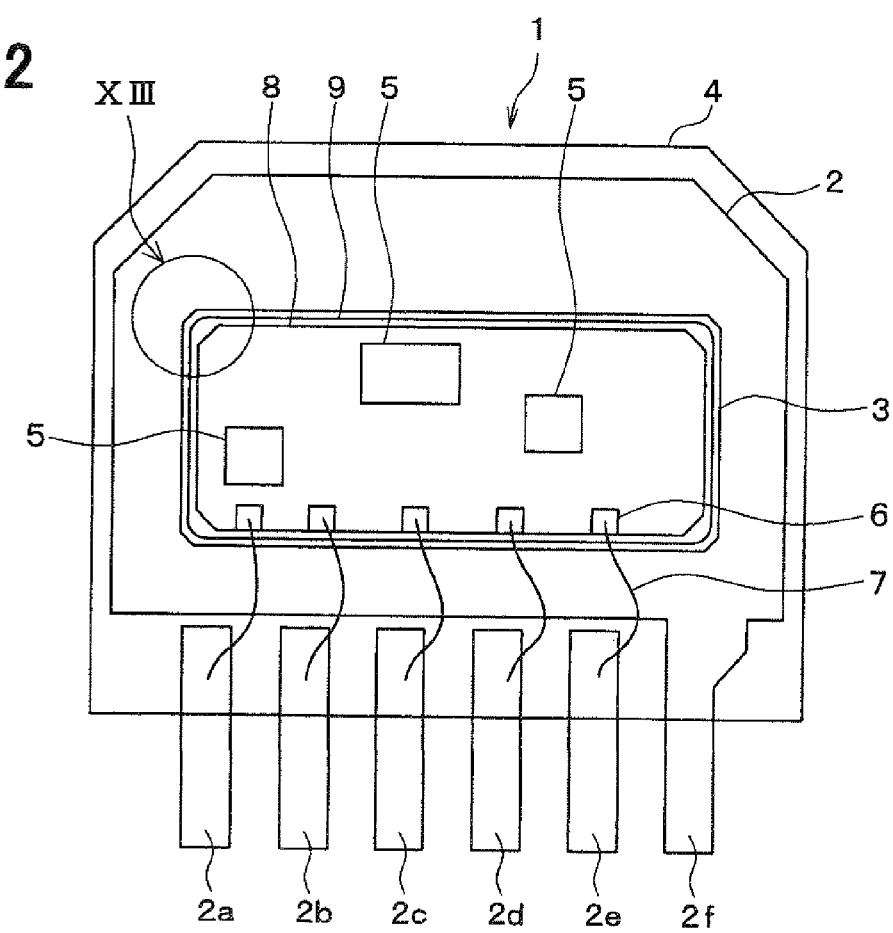
FIG. 12 is a schematic diagram showing a semiconductor device according to a fifth embodiment of the invention.
Figure 13:
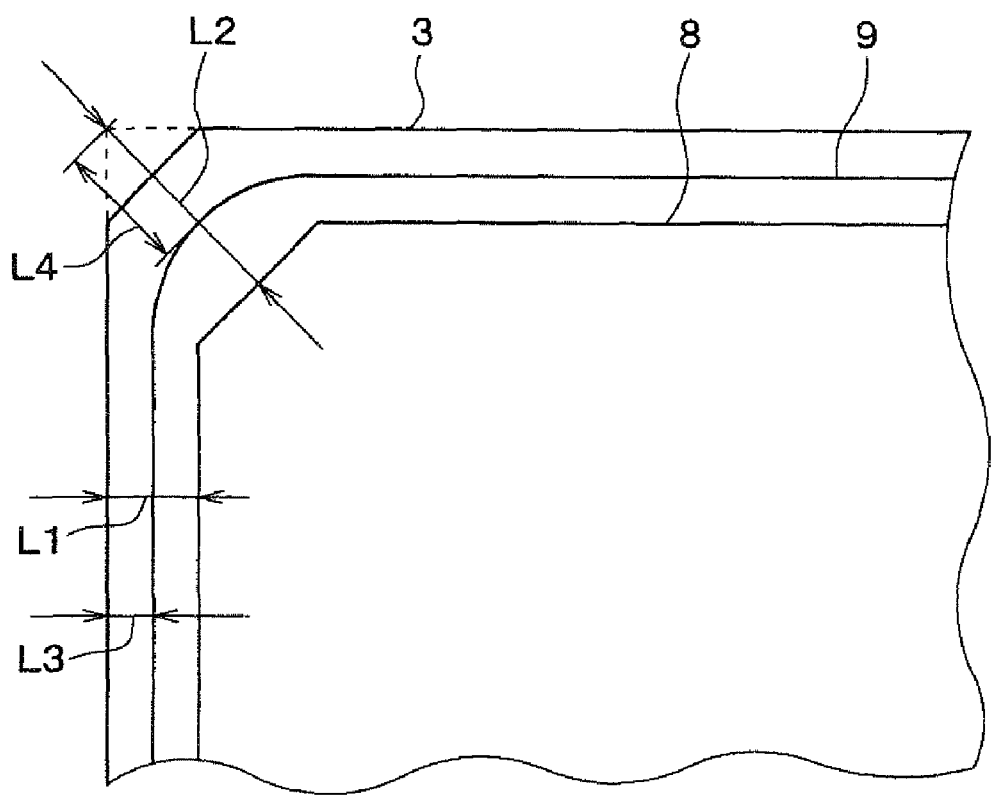
FIG. 13 is an enlarged view showing a part of the semiconductor device showing an arrow XIII in FIG. 12.

A semiconductor device 1 according to a fifth embodiment will be described with reference to FIGS. 12 and 13. As similarly with the fourth embodiment, the four corner portions of the circuit board 3 are chamfered. The other part of the semiconductor device 1 according to the fifth embodiment is almost similar with the semiconductor device 1 according to the second embodiment and the third embodiment.

Also in the present case, the circuit board 3 does not have the four corners, and thereby the fourth distance L4 cannot be defined as a distance from each of the four corners of the circuit board 3 to the outer-peripheral end of the resin coating 9. However, extended lines may be drawn from each of the four sides of the circuit board 3 as shown by dotted lines shown in FIG. 13, and four intersection points of the extend lines may be supposed as four hypothetical corners of the circuit board 3. Thereby, the fourth distance L4 is defined as the distance from each of the four hypothetical corners of the circuit board 3 to the outer-peripheral end of the resin coating 9. The fourth distance L4 is determined to satisfy the relationship described in the second embodiment. That is, the shapes of the protective coating glass 8 and the resin coating 9 are determined in such a manner that the fourth distance L4 is larger than the third distance L3. For example, the fourth distance L4 is larger than the third distance L3 by about 0.05 mm or more.

When the four corner portions of the circuit board 3 are chamfered, the stress to be applied to the four corner portions can be distributed due to the shape of the four corner portions.

Thus, the stress to be applied to the four corner portions of the circuit board 3 can be reduced, and thereby the resin coating 9 and the protective coating glass 8 can be prevented from being detached from the circuit board 3 more effectively.

Other Embodiments

In the first and the second embodiments, each of the four corner portions of the protective coating glass 8 is chamfered to have the side that inclines with respect to the four sides of the approximately rectangular shape of the protective coating glass 8, as an example. Alternatively, each of the four corner portions of the protective coating glass 8 may have other shape as long as the second distance L2 is larger than the first distance L1. For example, each of the four corner portions may have a curved shape. In the second embodiment, each of the four corner portions of the resin coating 9 has the curved shape, as an example. Alternatively, each of the four corner portions of the resin coating 9 may have other shape as long as the fourth distance L4 is larger than the third distance L3. For example, each of the four corner portions of the resin coating 9 may be chamfered to have a side that inclines with respect to the four sides of the approximately rectangular shape of the resin coating 9.

In the fourth embodiment and the fifth embodiment, each of the four corner portions of the circuit board 3 are chamfered to have the side that inclines with respect to the four sides of the circuit board 3, as an example. Alternatively, each of the four corner portions of the circuit board 3 may have other shape. For example, each of the four corner portions of the circuit board 3 may have a curved shape.

In the above-described embodiments, the circuit board 3 is made of ceramic, the resin part 4 is made of epoxy resin, and the protective coating glass 8 is made of protective coating glass resin, and the resin coating 9 is made of polyamide, polyamide-imide, or polyimide, as an example. Alternatively, other materials may be used as long as the materials satisfy the relationships of the strengths and the relationships of the arrangement.

Such changes and modifications are to be understood as being within the scope of the present invention as defined by the appended claims.

What is claimed is:

1. A semiconductor device comprising:
   a circuit board that has a substrate having an approximately rectangular shape including four sides and four corners, a mounted part disposed on the substrate and including a semiconductor element, a circuit wiring electrically coupled with the mounted part, and a pad electrically coupled with the circuit wiring;
   a wiring part that is fixed to the circuit board through an adhesive agent and that is electrically coupled with the pad;
   a protective coating glass that is disposed on the circuit board to cover the circuit wiring and that is arranged on an inside of the circuit board in such a manner that an outer-peripheral end of the protective coating glass is away from each of the four sides of the circuit board at a first distance and is away from each of the four corners of the circuit board at a second distance that is larger than the first distance; and
   a resin part that seals the circuit board, the wiring part, and the protective coating glass in such a manner that a part of the wiring part is exposed to an outside of the resin part and an outer-peripheral end portion of the circuit board located on an outside of the protective coating glass directly contact with the resin part.

2. The semiconductor device according to claim 1, wherein the protective coating glass has an approximately rectangular shape having four sides and four chamfered corner portions.

3. The semiconductor device according to claim 2, wherein each of the four chamfered corner portions has a side that inclines with respect to the four sides of the approximately rectangular shape of the protective coating glass.

4. The semiconductor device according to claim 1, wherein the first distance is larger than or equal to about 0.2 mm.

5. The semiconductor device according to claim 1, wherein the second distance is larger than or equal to about 0.35 mm.

6. The semiconductor device according to claim 1, wherein the substrate of the circuit board, the resin part, and the protective coating glass are made of materials that are selected in such a manner that a bonding strength A between the resin part and the protective coating glass, a bonding strength B between the protective coating glass and the substrate of the circuit board, a breaking strength C of the protective coating glass, and a bonding strength D between the resin part and the substrate of the circuit board satisfy relationships of $C<A$, $C<B$, and $C<D$.

7. The semiconductor device according to claim 1, further comprising
   a resin coating that is disposed to cover the protective coating glass and the mounted part, wherein:
   an outer-peripheral end of the resin coating is located between the outer-peripheral end of the protective coating glass and the four sides of the circuit board;
   the outer-peripheral end of the resin coating is away from each of the four sides of the circuit board at a third distance, and is away from each of the four corners of the circuit board at a fourth distance that is larger than the third distance; and
   a part of the outer-peripheral end portion of the circuit board located on an outside of the resin coating directly contact with the resin part.

8. The semiconductor device according to claim 7, wherein the third distance is larger than or equal to about 0.1 mm.

9. The semiconductor device according to claim 7, wherein the fourth distance is larger than or equal to about 0.15 mm.

10. The semiconductor device according to claim 1, further comprising
    a resin coating that is disposed to cover the protective coating glass and the mounted part, wherein:
    an outer-peripheral end of the resin coating is located between the outer-peripheral end of the protective coating glass and the four sides of the circuit board;
    a part of the outer-peripheral end of the resin coating that opposes to the four sides of circuit board is away from the outer-peripheral end of the protective coating glass at a fifth distance;
    another part of the outer-peripheral end of the resin coating that opposes to the four corners of the circuit board is away from the outer-peripheral end of the protective coating glass at a sixth distance; and
    a part of the outer-peripheral end portion of the circuit board located on an outside of the resin coating directly contact with the resin part.

11. The semiconductor device according to claim 10, wherein
    the fifth distance is larger than or equal to about 0.1 mm.

12. The semiconductor device according to claim 10, wherein
    the sixth distance is larger than or equal to about 0.1 mm.

13. The semiconductor device according to claim 10, wherein
the sixth distance is larger than the fifth distance.

14. The semiconductor device according to claim 7, wherein
the resin coating is made of polyamide.

15. The semiconductor device according to claim 7, wherein
the substrate of the circuit board, the resin part, the protective coating glass, and the resin coating are made of materials that are selected in such a manner that a bonding strength B between the protective coating glass and the substrate of the circuit board, a breaking strength C of the protective coating glass, and a bonding strength E between the resin part and the resin coating, a bonding strength F between the resin coating and the protective coating glass, and a bonding strength G between the resin coating and the substrate of the circuit board satisfy relationships of C<E, C<F, C<B, and C<G.

16. The semiconductor device according to claim 15, wherein
the substrate of the circuit board, the resin part, the protective coating glass, and the resin coating are made of the materials that are selected in such a manner that a bonding strength D between the resin part and the substrate of the circuit board, a breaking strength H of the resin coating, the bonding strength E, and the bonding strength G satisfy relationships of D<H, D<E, and D<G.

17. The semiconductor device according to claim 7, wherein
the resin coating has an approximately rectangular shape having four chamfered corner portions.

18. The semiconductor device according to claim 17, wherein
each of the four chamfered corner portions has a curved shape.

19. A semiconductor device comprising:
a circuit board that has a substrate having an approximately rectangular shape, a mounted part disposed on the substrate and including a semiconductor element, a circuit wiring electrically coupled with the mounted part, and a pad electrically coupled with the circuit wiring, wherein the approximately rectangular shape has four sides and four chamfered corner portions, and extended lines that are drawn from the four sides cross each other at four intersection points;
a wiring part that is fixed to the circuit board through an adhesive agent and that is electrically coupled with the pad;
a protective coating glass that is disposed on the circuit board to cover the circuit wiring and that is arranged on an inside of the circuit board in such a manner that an outer-peripheral end of the protective coating glass is away from each of the four sides of the circuit board at a first distance and is away from each of the four intersection points at a second distance that is larger than the first distance; and
a resin part that seals the circuit board, the wiring part, and the protective coating glass in such a manner that a part of the wiring part is exposed to an outside of the resin part and an outer-peripheral end portion of the circuit board located on an outside of the protective coating glass directly contact with the resin part.

20. The semiconductor device according to claim 19, wherein
each of the four chamfered corner portions has a side that inclines with respect to the four sides of the approximately rectangular shape.

* * * * *